US006842002B2

(12) United States Patent
Cheng et al.

(10) Patent No.: US 6,842,002 B2
(45) Date of Patent: Jan. 11, 2005

(54) C-SHAPED MAGNETIC RESONANCE IMAGING SYSTEM

(75) Inventors: Illich Cheng, Richmond (CA); Paul J. Jungwirth, Burnaby (CA); Alan J. Otter, Delta (CA); Yan Wu, Burnaby (CA)

(73) Assignee: Millennium Technology, Inc., Richmond (CA)

( * ) Notice: Subject to any disclaimer, the term of this patent is extended or adjusted under 35 U.S.C. 154(b) by 0 days.

(21) Appl. No.: 10/181,832

(22) PCT Filed: Jan. 19, 2001

(86) PCT No.: PCT/CA01/00060
§ 371 (c)(1),
(2), (4) Date: Jul. 18, 2002

(87) PCT Pub. No.: WO01/53847

PCT Pub. Date: Jul. 26, 2001

(65) Prior Publication Data

US 2003/0001575 A1 Jan. 2, 2003

(51) Int. Cl.⁷ .................................................. G01V 3/00
(52) U.S. Cl. ........................ 324/318; 324/319; 324/320
(58) Field of Search ............................... 324/318, 319, 324/320; 335/306, 216

(56) References Cited

U.S. PATENT DOCUMENTS

| 4,870,380 A | | 9/1989 | McGinley |
| 5,003,276 A | | 3/1991 | Sarwinski et al. |
| 5,315,276 A | * | 5/1994 | Huson et al. ............... 335/216 |

(List continued on next page.)

FOREIGN PATENT DOCUMENTS

| CN | 94115507 | 4/1996 |
| EP | 0371775 | 6/1990 |
| EP | 0407227 | 1/1991 |
| EP | 0432750 | 6/1991 |
| EP | 0619500 | 10/1994 |
| GB | 2311 375 | 9/1997 |
| JP | 08045729 | 2/1996 |
| WO | PCT/US83/01175 | 2/1984 |

OTHER PUBLICATIONS

J. H. Jensen and M.G. Abele. Maximally efficient permanent magnet structures, J. Appl. Phys. 79(2), Jan. 15, 1996, 1157, 1158, 1160, 1163.

Manli G. Abele and Henry Rusinek, Field Distortion Caused by Magnetization Tolerances of Permanent Magnets, IEEE Transctions on Magentics, vol. 29, No. 6, Nov. 1993, 2908, 2909.

M.G. Abele, Generation of highly uniform fields with permanent magnets (invited), J. Appl. Phys. 76(10) Nov. 15, 1994, 6427, 6248, 6250, 6252.

M.G. Abele, Equivalent structures of permanent magnets and electric currents designed to generate uniform fields, J. Appl. Phys. 75(10) May 15, 1994, 6993, 6994.

J.H. Jensen and M.G. Abele, Effects of field orientation on field uniformly in permanent magnet structures, J. Appl. Phys. 76(10) Nov. 15, 1994, 6853, 6854.

*Primary Examiner*—Diego Gutierrez
*Assistant Examiner*—Tiffany A. Fetzner
(74) *Attorney, Agent, or Firm*—Glenn Patent Group; Michael A. Glenn

(57) ABSTRACT

An open C magnet system for magnetic resonance imaging comprises circular NdFeB poles, a single piece yoke having beveled inside and outside faces between the vertical post section and the horizontal arms of the yoke, a necked-in mid-section of the vertical post, flat Nebdymium (NdFeB) corner plates in face to face relationship with the inside beveled faces between the vertical post and the horizontal arms.

3 Claims, 3 Drawing Sheets

U.S. PATENT DOCUMENTS

| | | |
|---|---|---|
| 5,389,909 A | 2/1995 | Havens |
| 5,431,165 A | 7/1995 | Sellers |
| 5,446,434 A | 8/1995 | Dorri et al. |
| 5,495,222 A | 2/1996 | Abele et al. |
| 5,623,241 A | 4/1997 | Minkoff |
| 5,729,188 A | 3/1998 | Siebold et al. |
| 5,798,680 A | 8/1998 | Abele et al. |
| 5,864,275 A * | 1/1999 | Ohashi et al. ............... 335/306 |
| 5,900,793 A | 5/1999 | Katznelson et al. |
| 5,963,117 A * | 10/1999 | Ohashi et al. ............... 335/306 |
| 6,150,819 A * | 11/2000 | Laskaris et al. ............. 324/319 |
| 6,211,676 B1 * | 4/2001 | Byrne et al. ................. 324/319 |
| 6,259,252 B1 * | 7/2001 | Laskaris et al. ............. 324/319 |
| 2003/0001575 A1 * | 1/2003 | Cheng et al. ................ 324/318 |

* cited by examiner

C-SHAPED MAGNETIC RESONANCE IMAGING SYSTEM

This application is a 371 of PCT/CA01/00060 filed Jan. 19, 2001 which claims benefit of provisional application 60/176,807 filed Jan. 19, 2000.

FIELD OF THE INVENTION

This invention relates to the design of permanent magnet structures, and more particularly it relates to an Open-C shaped permanent magnet design.

BACKGROUND OF THE INVENTION

Magnetic resonance imaging ("MRI") is used primarily in medical settings to is produce high quality images of the inside of the human body. MRI is based on the principles of nuclear magnetic resonance ("NMR"), a spectroscopic technique used by scientists to obtain information about the microscopic chemical and physical characteristics of molecules. MRI started out as a tomographic imaging technique, producing an image of the NMR signal as a thin slice through the human body. MRI has now advanced beyond tomographic imaging to become a volume imaging technique.

The MRI image is created when the nuclei of atoms are placed in a magnetic field and are exposed to non-ionizing radio frequency ("RF") energy at a specific frequency. An RF pulse is emitted that excites the nuclei away from equilibrium.

When the pulse is switched off, the nuclei return to their original state and in the process emit energy at RF frequencies. The signal is picked up by a receiver coil and is converted into images through the application of a sophisticated mathematical algorithm An MRI system comprises a main magnet, a gradient system. RF coils, a transmitter, a receiver and a computer equipped with imaging software. The magnets in an MRI system may be superconducting magnets, electromagnets or permanent magnets.

A permanent magnet system differs from superconducting magnet systems in that superconducting systems require significant amounts of electricity and liquid helium for maintaining coolant circulation, air conditioning systems, and for the various electronics components. The site requirements for superconducting systems are also more demanding than for permanent magnet systems due to the specific needs of the cryogen.

Electromagnets also require cooling (usually by water) and produce a relatively weak magnetic field.

Strong magnetic fields, low eddy currents and a high degree of homogeneity of the magnetic field are critical to producing good quality MRI images. Most prior art MRI systems using permanent magnets are limited in the strength of the magnetic fields they can produce having regard to the magnetic materials generally available to produce the magnets.

Japanese Patent 08045729 to Sumitomo Special Metals Co. Ltd., dated Feb. 16, 1996 discloses a magnetic field generating device for an MRI incorporating a C-shaped yoke.

Chinese Patent 94115507.2 to Dong et al., dated Apr. 24, 1996 discloses an Open-C shaped permanent magnet design. The production model of the magnet was made with poles made of NdFeB. While this material has very good magnetic properties, it is very expensive. As such it is not commonly used for large permanent magnets. The cost of the NdFeB used in the Dong et al. design remains high.

The Dong et al. design uses octagonal poles, pole pieces and rings. However the octagonal shapes produce regions of high flux density at the corners of the octagons, which distorts the shape of the field in the imaging volume (the gap between the poles). Ideally, the horizontal cross-section of the field in the gap is perfectly circular. It is not possible to achieve this with the octagonal design without careful shimming to correct the field distribution after the magnet is to manufacture. The Dong et al. design is therefore limited in the homogeneity of magnetic field it can achieve, and suffers the disadvantage of requiring elaborate shimming and having high eddy currents.

The Dong et al. design also uses a stepped shape of corner pieces of magnetic material (steel) located at the inside corners of the "C". This was done to decrease the amount of metal and thus reduce the weight and cost of the magnet. However, this results in some areas having too much material removed and some too little. This causes saturation in the steel and increases the amount of leakage flux and the size of the field away from the magnet. For safety reasons, this requires a larger room.

The outer edges of the pole piece and rings on the Doug et al. magnet extend vertically from the pole. The function of these pieces is to improve the uniformity of the field in the gap, but if improperly designed, they reduce the efficiency of the magnet thus requiring a larger than necessary amount of NdFeB to be used to obtain the desired field strength.

In addition, a significant amount of time is needed to shim the Dong et al. magnet after it is manufactured. The Dong et al. pole pieces were made of steel which is desirable to improve the homogeneity of the field, however it has very low resistively which allows eddy currents to form when an MRI scan is being performed. Eddy currents reduce the signal to noise ratio of the system, resulting in poorer images. The Dong et al. magnet was created out of a number of steel plates that had to be machined to the proper dimensions, and bolted together. This increased the cost of each magnet significantly. Furthermore, since the yoke is bolted together, there is an increased risk that the magnetic force between the poles of the magnet could be stronger than the bolt strength holding the yoke arms parallel. To eliminate this risk, vertical columns needed to be added between the yoke arms as additional support members. This partially obstructed the gap between the poles causing difficulties in positioning the patient bed in the gap during scans.

It is an object of the present invention to provide an Open-C shaped, NdFeB-based permanent magnet design that minimizes the amount of NdFeB required, but that nonetheless provides good homogeneity of field in the gap, minimizes the need for shimming and minimizes eddy currents.

SUMMARY OF THE INVENTION

This invention is a permanent open C-type magnet.

In one of its aspects, the invention comprises a magnetic resonance imaging magnet system comprising a generally C-shaped yoke formed from a single piece of cast steel. The yoke has a vertical post, diagonal sections extending from each end of the post, the diagonal sections having angled inside and outside faces, and a substantially horizontal arm extending from each of the diagonal sections. A pair of poles is supported on the arms, the poles being made substantially of NdFeB and having pole faces in opposed and spaced relation to define an imaging volume between them. The post has a portion of reduced width at its medial extent. The ends of the arms adjacent the imaging volume are also beveled inward on the opposite side from the imaging volume. A substantially flat magnetized NdFeB plate is mounted on the inside face of each of said diagonal sections in face to face relationship with said inside face, the inside face and the plate defining an angle of approximately 45 degrees in relation to the post, and the plates are poled to oppose leakage flux between the nearest pole and the post. A composite pole plate of magnetic material is mounted on each of the pole faces. Each of the pole plates comprises a tape wound laminated thin sheet of silicon steel with an insulating adhesive between the layers, the laminated sheet being segmented into a plurality of wedge-shaped elements formed into a circular disk shape with an insulating adhesive between the respective elements. Each of the pole plates is covered with a layer of high resistivity material and a pole ring is mounted on each of the pole plates.

In another aspect of the invention, the imaging volume has a vertical extent of at least 0.47 m, the diameter of the poles is between 1.0 and 1.2 m, and the thickness of the pole plates is between 45 and 60 mm. The post has a vertical extent of between 1.8 and 1.9 m, the width of the diagonal sections is between 1.2 and 1.4 m, and the depth of the post is between 1.7 and 1.9 m.

The Open-C shaped permanent magnet according to the invention produces 0.35T mid-field strength that is much better than the other permanent magnet designs available it market.

The invention will be more fully appreciated by reference to the detailed description of the preferred embodiment that follows.

BRIEF DESCRIPTION OF THE DRAWINGS

The preferred embodiment will be described by reference to the drawings thereof in which.

DETAILED DESCRIPTION OF THE PREFERRED EMBODIMENT

Figure 1:
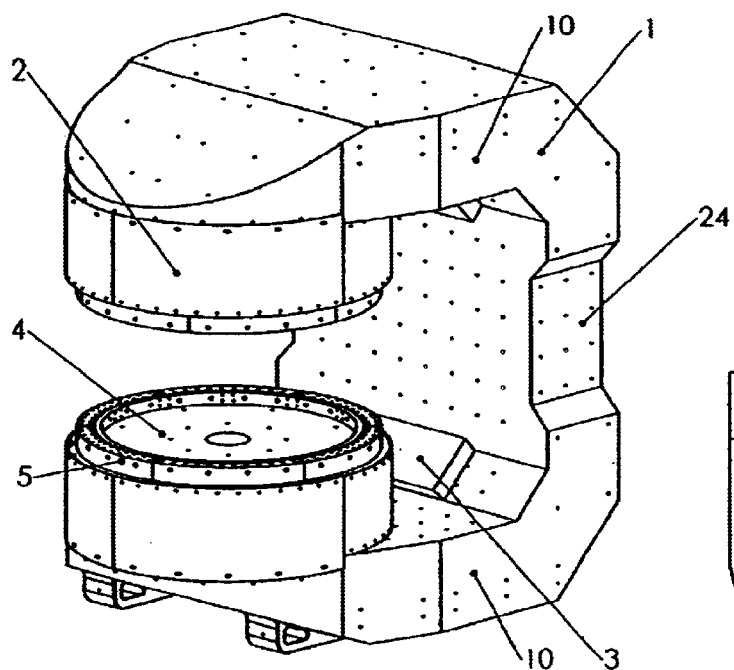
FIG. 1 is a perspective view of the magnet structure according to the preferred embodiment of the invention.
Figure 2:
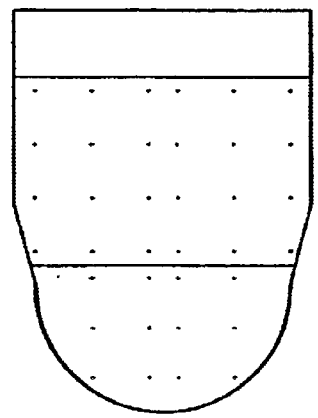
FIG. 2 is a top view of the magnet structure.

FIG. 1 is a perspective view illustrating the overall appearance of the magnet structure embodying the present invention.

The main components of the magnet are the yoke 1, the pole 2, corner NdFeB magnet pieces 3, the pole plate 4, and the rings 5.

The yoke 1 is generally C-shaped. This is preferable over standard tunnel systems or other open systems in terms of patient comfort and patient accessibility for doctors and radiologists since it is open on three sides. The open C-shaped design also provides for the possibility of MRI guided interventional surgery which is of significant future importance. The yoke has a vertical post and two horizontal arms 10 extending from the post. The magnet poles 2 depend from the ends of the arms 10. Pole plates 4 and rings 5 are provided on the faces of the poles 2.

The gap between opposed rings 5 that define the imaging volume is preferably 0.47 m or greater. With respect to the yoke 1, its height is preferably 1.83 m, its width at its widest part is preferably 1.31 m, and its depth is preferably 1.8 m. The diameter of the pole 2 is preferably 1.11 m. It is contemplated that these dimensions could vary such that the diameter of the poles is between 1.0 and 1.2 m, and the thickness of the pole plates is between 45 and 60 mm. The post may have a vertical extent of between 1.8 and 1.9 m, and the width of the diagonal sections may be between 1–2 and 1.4 m. The depth (thickness) of the post may be between 1.7 and 1.9 m.

The size of the magnet, the gap size, and the large homogeneous field volume produced are such that it allows the magnet to be used as a whole body scanning system.

As can be seen in FIG. 1, on the inside faces of the arms 10 of the yoke 1 are mounted two oppositely poled magnet elements or poles 2 which are of NdFeB, a permanently magnetized material. The facing surfaces of the poles 2 are provided with pole plates 4, and rings 5. These are made of a material suitable to shape the magnetic field in the center of the gap into a very homogeneous distribution ideal for MRI. The characteristics of the material used in the pole plates 4 and the rings 5 will be further discussed below.

Figure 4:
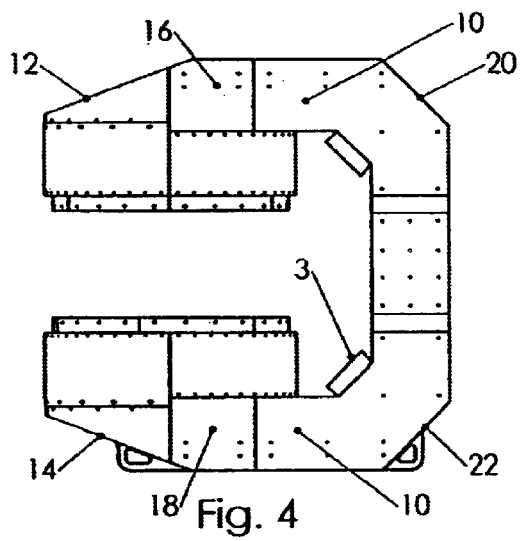
FIG. 4 is a side view of the magnet structure.

Corner NdFeB magnet plates 3 are mounted on the inside angled faces of the yoke 1 in face to face relationship with the inside angled corners of the yoke, as seen in FIG. 4. The magnet plates 3 are poled to oppose the tendency to establish a return path from the arms and the poles to the post of the yoke. This improves the homogeneity of the magnetic field in the imaging volume.

Figure 3:
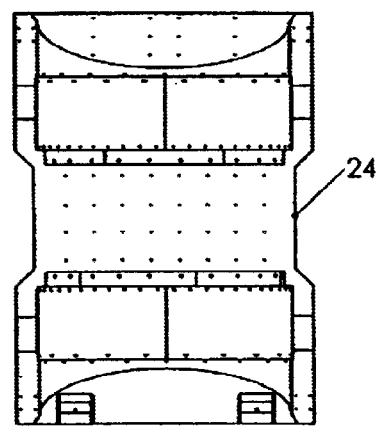
FIG. 3 is a front view of the magnet structure.

The yoke 1 serves two main functions, namely to provide a low reluctance return path for the magnetic field, and to provide mechanical support for the magnet poles 2. The precise shape of the yoke shown in FIGS. 1–4 was designed to give improved magnetic performance for MRI applications while allowing as open an area for the patient as possible. Among the characterizing features of the design are the angled faces 12, 14, 16, 18, 20, and 22 on the top and bottom, front and back as shown in FIG. 4, the necked-in section 24 best seen in FIGS. 1 and 3, and the major dimensions referred to above mentioned. All of these serve to maintain functionality and efficiency while reducing the weight of the magnet as much as possible.

The yoke 1 is also formed from a single cast piece of steel. This has significant consequences. It reduces the cost of machining and assembling large individual pieces of plate steel, which is very important when production of many identical units is desired. It also ensures that all the units produced will be of the same quality since they are all made from the same mold. Finally, it improves the structural integrity of the yoke. Since the magnet poles strongly attract one another, and the weight of the top pole is not insignificant, the arms 10 of the yoke 1 must be able to withstand these forces and prevent the magnet poles 2 from pulling together, which is a significant safety issue. In fact, the yoke must be strong enough so that the arms remain parallel. If they were to deflect even slightly, the homogeneity of the field in the gap would be compromised. Casting the yoke in a single piece and in the shape shown ensures that the strength of the yoke is more than sufficient to prevent the magnet poles from coming together, and that they remain parallel. In a C-shape configuration, this is not as easy to achieve with a yoke made of individual pieces bolted together without using additional support struts, etc., which can interfere with the oppress of the design. In other permanent magnet designs, either a C-shape yoke is not employed, but rather 4 pillars are used equally spaced around the magnet poles, or a C-shape with two support pillars has been used.

The corner Neodymium (NdFeB) pieces 3 are located on the inside angled faces of the yoke as shown in FIG. 1. Since the yoke size was reduced as much as possible, as explained previously, this brings the magnet poles 2 close to the vertical back section of the yoke. Normally, this would cause the field in the gap to be distorted since some of the flux that should travel vertically between the two poles would prefer to 'short' back to the yoke. This would adversely affect the homogeneity. To compensate for this, the corner elements 3 are used and are mounted at a 45 degree angle as shown, to be most effective in preventing the distortion of the field. To prevent this distortion without the corner magnet elements, the yoke arms would need to be extended significantly so that the magnet poles 2 would be far from the vertical section of the yoke. However his would greatly increase the weight of the yoke (because of all the added material) and would complicate the problem of keeping the arms parallel. The volume of the permanent magnet material used in each corner is optimized to ensure that the field in the gap is as homogeneous as possible, and for this design is preferably 8000 cubic cm.

The pole plate 4 and rings 5 shown in FIG. 1 are very important to controlling the uniformity of the field in the gap as mentioned previously. The pole plate must be of a certain thickness to essentially average out the field produced by the permanent magnet material of the magnet pole on which it is mounted, however, it cannot be too thick that it significantly reduces the intensity of the field. For this design, the thickness of pole plate 4 is preferably 53 mm. The function of the rings 5 is to increase the volume of the region of the homogeneous field in the gap, and its height and width are carefully optimized for this. For this design the cross-section of rings 5 is preferably 67 mm high and 83 mm wide. These elements are preferably made of steel or another material with similar magnetic characteristics to properly shape the field without reducing the field strength, or saturating which reduces the efficiency of the magnet and increases the leakage flux.

One other important characteristic of the material used for the pole plate 4 and the rings 5 is the electrical resistivity. Using plain steel or iron for these components, during a MRI scan, would result in easy generation of eddy currents in the elements so as to cause artifacts in the image. To reduce this effect in this magnet, the material used for the pole plate and rings is a thin strip of silicon steel that has been folded over itself and laminated together.

Figure 5:
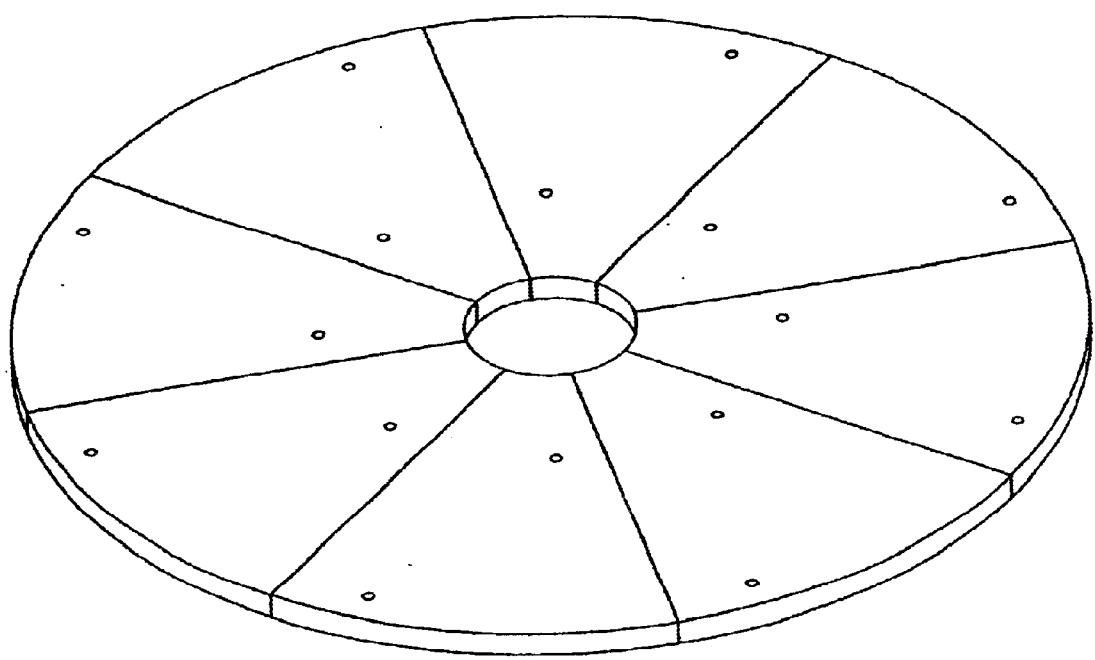
FIG. 5 is a perspective view illustrating the general arrangement of the pole piece.
Figure 6:
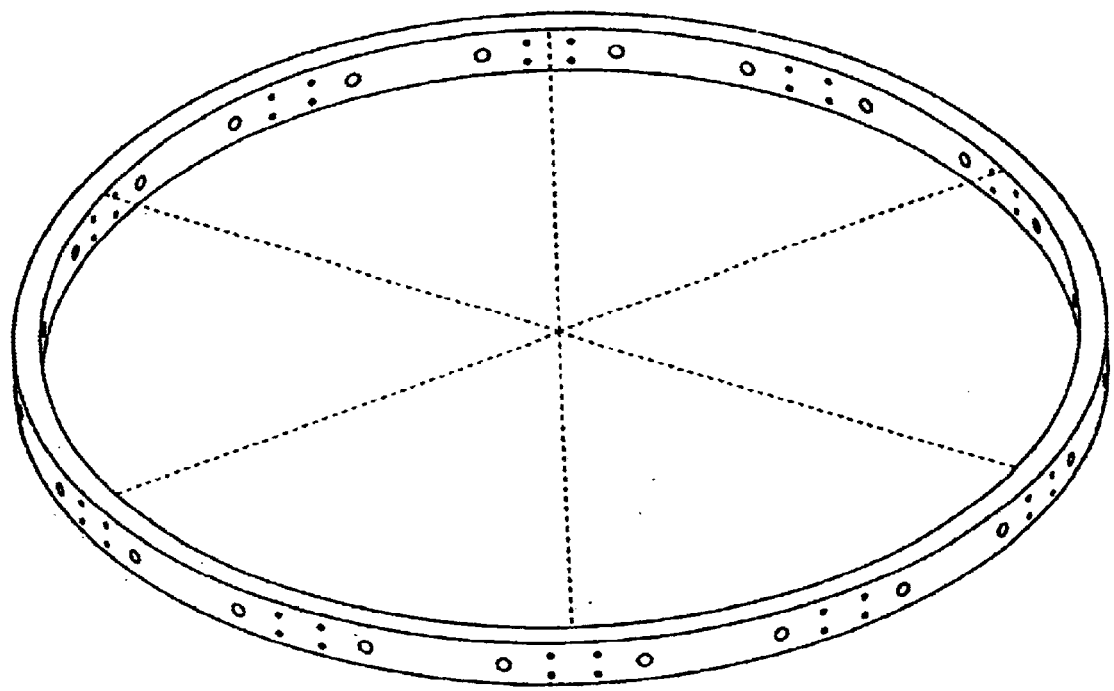
FIG. 6 is a perspective view illustrating the general arrangement of the pole ring.

The elements of the pole plate laminated material are cut into pie-shaped sections and reassembled as shown in FIG. 5 and FIG. 6 in order to prevent eddy currents from travelling in complete circular paths around the elements. The selection of the material and producing such a laminated assembly is crucial to the performance of the magnet since both the magnetic properties and the electrical properties are important and it is not easy to optimize them simultaneously.

The pole plate 4 is constructed by 'tape winding' in a spiral a long, thin strip of silicon steel, and applying an insulating epoxy between successive layers of the spiral to hold it together. In this manner, the plate is constructed to the proper outer dimensions. Once the adhesive has cured, the top and bottom of the plate are ground and etched to ensure that the plate is of the proper thickness. This plate is then cut into several wedge-shaped sectors to prevent eddy currents from circulating around the winding. These pieces are then coined again using an insulating epoxy. This results in a solid plate which is then machined with proper mounting holes for the ring, and the magnet yoke. The ring is also produced in a similar fashion using a tape wound lamination. It is cut into several sections, and bonded together and onto the top of the laminated pole plate. We have found that this manner of producing laminated and composite pole plates effectively reduces the eddy currents.

The material used is silicon steel which has a higher resistivity than other steel, which is important in reducing eddy currents. However, the effect of the laminations on the magnetic field is not good compared to solid metal. For this reason, the stacking factor should be as high as possible, which requires a very thin metal strip for winding and good process control.

It will be appreciated that certain modifications may be made to the preferred embodiment described above without departing from the principles of the invention.

What is claimed is:

1. A magnetic resonance imaging permanent magnet system comprising:

a generally C-shaped yoke (1) formed from a single piece of cast steel;

said yoke (1) having a vertical post (24), said vertical post having two ends, said yoke further comprising diagonal sections (20, 22) extending from each end of said vertical post, said diagonal sections having angled inside and outside faces, said inside faces defining an angle of approximately 45 degrees in relation to said vertical post, and said yoke further comprising substantially horizontal arms (10, 12, 16; and 10, 14, 18) extending from each of said diagonal sections;

a pair of poles (2) supported on said horizontal arms (10), each of said poles (2) being made substantially of permanently magnetized NdFeB and having respective pole faces which are opposed to one another and in a spaced relation to define an imaging volume between said pole faces;

said vertical post having a portion of reduced width at its medial extent, with said vertical post (24) being wider at an intersection thereof with said diagonal sections (20,22);

the ends of said horizontal arms (12, 14) adjacent said imaging volume being beveled inward on the opposite side from the imaging volume;

a substantially flat permanently magnetized NdFeB plate (3) mounted on the surface of the inside face of each of said diagonal sections (20, 22) in face to face relationship with said inside face toward said imaging volume, said inside face and said plate (3) defining an angle of approximately 45 degrees in relation to said horizontal post, said plates (3) being poled to oppose leakage flux between the nearest pole (2) and the post, and to maintain the flux both in the imaging volume and in the vertical post;

a pair of composite pole plates (4), one pole plate mounted on each of said pole faces on either side of the imaging volume, each of said pole plates (4) comprising a tape wound laminated thin sheet of high resistivity silicon steel with an insulating adhesive between each layer of the tape, and wherein said laminated sheet is segmented into a plurality of wedge-shaped elements, with said wedge-shaped elements being formed into a circular disk shape with an insulating adhesive between the respective wedge-shaped elements; and a pole ring (5) mounted on each of said pole plates (4).

2. A magnet system as in claim 1 wherein said imaging volume has a vertical extent of at least 0.47 m, with the diameter of said poles (2) being between 1.0 m and 1.2 m, and the thickness of said pole plates (4) being between 45 mm and 60 mm.

3. A magnet system as in claim 2 wherein the vertical post (24) has a vertical extent between 1.8 m and 1.9 m, with the width of said diagonal sections being between 1.2 m and 1.4 m, and with the depth of said vertical post (24) being between 1.7 m and 1.9 m.

* * * * *